United States Patent
Den Boef et al.

(10) Patent No.: US 10,025,199 B2
(45) Date of Patent: Jul. 17, 2018

(54) METHOD OF DESIGNING METROLOGY TARGETS, SUBSTRATES HAVING METROLOGY TARGETS, METHOD OF MEASURING OVERLAY, AND DEVICE MANUFACTURING METHOD

(71) Applicant: ASML Netherlands B.V., Veldhoven (NL)

(72) Inventors: Arie Jeffrey Den Boef, Waalre (NL); Kaustuve Bhattacharyya, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 438 days.

(21) Appl. No.: 14/656,510

(22) Filed: Mar. 12, 2015

(65) Prior Publication Data

US 2015/0346605 A1 Dec. 3, 2015

Related U.S. Application Data

(60) Provisional application No. 62/006,524, filed on Jun. 2, 2014.

(51) Int. Cl.
*G03F 7/20* (2006.01)
*G03F 9/00* (2006.01)
*H01L 23/544* (2006.01)

(52) U.S. Cl.
CPC .......... *G03F 7/705* (2013.01); *G03F 7/70158* (2013.01); *G03F 7/70633* (2013.01);
(Continued)

(58) Field of Classification Search
None
See application file for complete search history.

(56) References Cited

U.S. PATENT DOCUMENTS 7,061,615 B1 6/2006 Lowe-Webb
8,214,771 B2 7/2012 Adel et al.
(Continued)

FOREIGN PATENT DOCUMENTS

CN 101526750 A 9/2009
JP 2006-157023 A 6/2006
(Continued)

OTHER PUBLICATIONS

International Search Report directed to related International Patent Application No. PCT/EP2014/066616, dated Feb. 2, 2015; 3 pages.
(Continued)

*Primary Examiner* — Khaja Ahmad
(74) *Attorney, Agent, or Firm* — Sterne, Kessler, Goldstein & Fox P.L.L.C.

(57) ABSTRACT

Metrology targets are formed by a lithographic process, each target comprising a bottom grating and a top grating. Overlay performance of the lithographic process can be measured by illuminating each target with radiation and observing asymmetry in diffracted radiation. Parameters of metrology recipe and target design are selected so as to maximize accuracy of measurement of overlay, rather than reproducibility. The method includes calculating at least one of a relative amplitude and a relative phase between (i) a first radiation component representing radiation diffracted by the top grating and (ii) a second radiation component representing radiation diffracted by the bottom grating after traveling through the top grating and intervening layers. The top grating design may be modified to bring the relative amplitude close to unity. The wavelength of illuminating radiation in the metrology recipe can be adjusted to bring the relative phase close to $\pi/2$ or $3\pi/2$.

9 Claims, 12 Drawing Sheets

(52) U.S. Cl.
CPC .......... *G03F 7/70683* (2013.01); *G03F 9/708* (2013.01); *H01L 23/544* (2013.01)

(56) References Cited

U.S. PATENT DOCUMENTS

| | | | |
|---|---|---|---|
| 8,913,237 B2 | 12/2014 | Levinski et al. | |
| 2004/0257571 A1* | 12/2004 | Mieher | G01N 21/956 356/401 |
| 2005/0122516 A1* | 6/2005 | Sezginer | G03F 7/70633 356/401 |
| 2006/0033921 A1 | 2/2006 | Den Boef et al. | |
| 2006/0117293 A1 | 6/2006 | Smith et al. | |
| 2010/0201963 A1 | 8/2010 | Cramer et al. | |
| 2010/0328655 A1 | 12/2010 | Den Boef | |
| 2011/0027704 A1 | 2/2011 | Cramer et al. | |
| 2011/0043791 A1 | 2/2011 | Smilde et al. | |
| 2011/0069292 A1 | 3/2011 | Den Boef | |
| 2012/0033215 A1 | 2/2012 | Kandel et al. | |
| 2012/0044470 A1 | 2/2012 | Smilde et al. | |
| 2012/0123581 A1 | 5/2012 | Smilde et al. | |
| 2013/0035888 A1* | 2/2013 | Kandel | G03F 7/70633 702/81 |
| 2013/0258310 A1 | 10/2013 | Smilde et al. | |
| 2013/0271740 A1 | 10/2013 | Quintanilha | |
| 2015/0138523 A1 | 5/2015 | Jak et al. | |
| 2015/0145151 A1 | 5/2015 | Van Der Schaar et al. | |
| 2015/0204664 A1* | 7/2015 | Bringoltz | G03F 7/70683 356/492 |
| 2015/0234290 A1 | 8/2015 | Mathijssen et al. | |

FOREIGN PATENT DOCUMENTS

| | | |
|---|---|---|
| TW | 201403257 A | 1/2014 |
| TW | 201416806 A | 5/2014 |
| WO | WO 2009/078708 A1 | 6/2009 |
| WO | WO 2009/106279 A1 | 9/2009 |
| WO | WO 2013/178422 A1 | 12/2013 |
| WO | WO 2014/062972 A1 | 4/2014 |
| WO | WO 2014/074873 A1 | 5/2014 |
| WO | WO 2014/146906 A2 | 9/2014 |

OTHER PUBLICATIONS

International Preliminary Report on Patentability and Written Opinion of the International Searching Authority directed to related International Patent Application No. PCT/EP2014/066616, dated Dec. 6, 2016; 7 pages.

Chen, K.-H., et al., "Improving on-product performance at litho using integrated diffraction-based metrology and computationally designed device-like targets fit for advanced technologies (incl. FinFET)," Metrology, Inspection, and Process Control for Microlithography XXVIII, Proceedings of SPIE, vol. 9050, 2014; pp. 90500S-1 to 90500S-10.

Huang, G.T., et al., "Improving on-product performance via litho-cluster control using integrated, process-robust, diffraction-based metrology fueled by computationally designed device-like targets fit for advanced technologies (incl. FinFET)," SPIE Advanced Lithography Presentation, 2014; 23 slides.

* cited by examiner

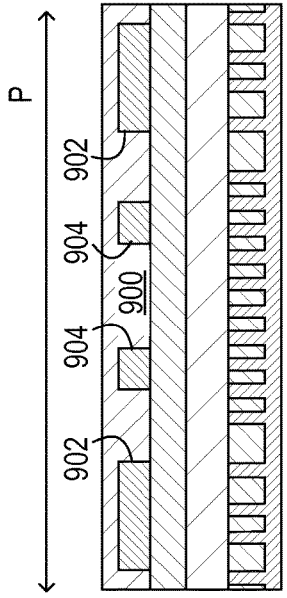
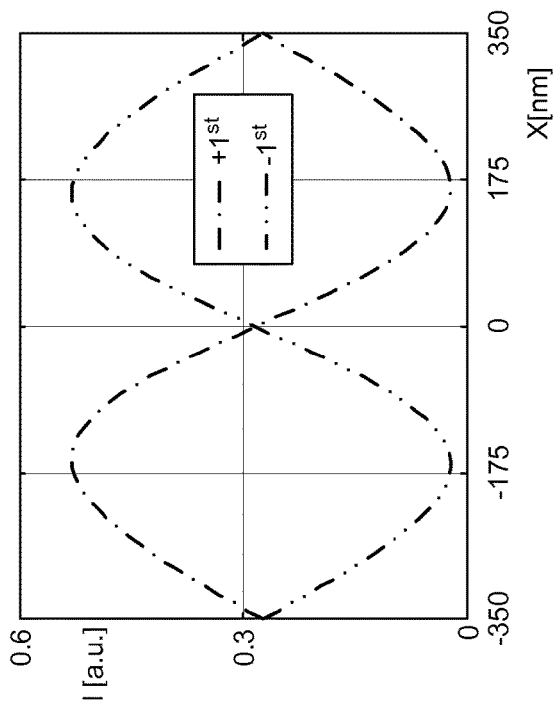
Fig. 14(a)
Fig 14(c)
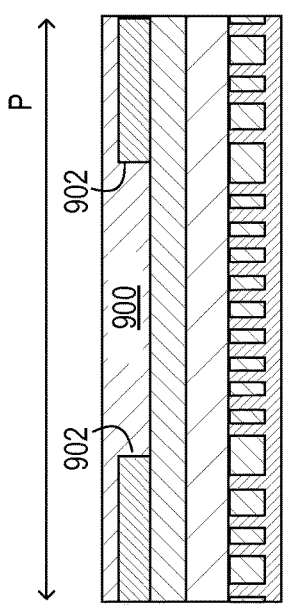
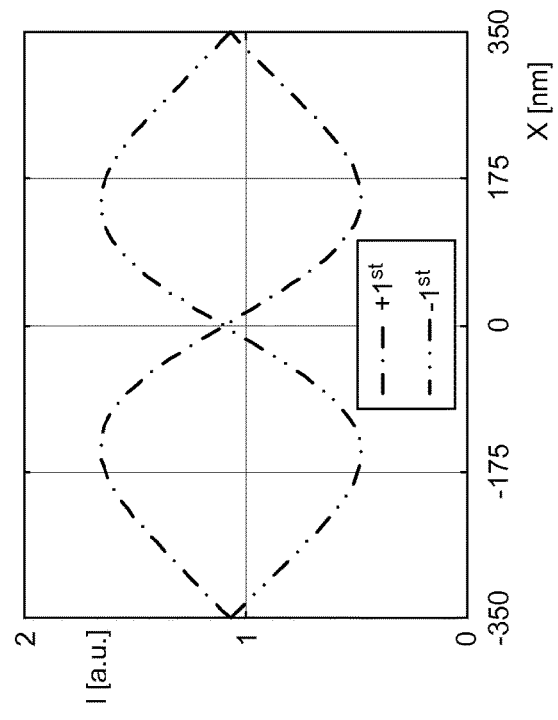
Fig. 14(b)
Fig. 14(d)

METHOD OF DESIGNING METROLOGY TARGETS, SUBSTRATES HAVING METROLOGY TARGETS, METHOD OF MEASURING OVERLAY, AND DEVICE MANUFACTURING METHOD

CROSS REFERENCE TO RELATED APPLICATIONS

The present invention is related to U.S. Provisional Patent Application No. 62/006,524, which is incorporated by reference herein in its entirety.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

In the known metrology technique, overlay measurement results are obtained by measuring the target twice under certain conditions, while either rotating the target or changing the illumination mode or imaging mode to obtain separately the −1st and the +1st diffraction order intensities. Comparing these intensities for a given grating provides a measurement of asymmetry in the grating, and asymmetry in an overlay grating can be used as an indicator of overlay error.

As is known, each product and process requires care in the design of metrology targets and the selection of an appropriate metrology "recipe" by which overlay measurements will be performed. Known ways of working aim for example to improve reproducibility in the measurement, measured for example by "total measurement uncertainty" or TMU. The inventors have found that these known design techniques are not fully successful in certain situations, and may lead to measurements that are consistent between themselves, but are not as accurate as they could be in a real manufacturing environment.

SUMMARY

It is desirable to provide a design method for overlay targets and metrology recipes in which accuracy is better defined and controlled, and which is robust against process-induced variations.

A first embodiment provides a method of designing metrology targets to be formed by a lithographic process. Each target comprises a first periodic structure to be formed in a lower layer on a substrate and a second periodic structure to be formed above the first periodic structure in an upper layer on the substrate, such that overlay performance of the lithographic process can be measured by illuminating each target with radiation and observing asymmetry in certain portions of a resulting diffraction spectrum. Values for the metrology recipe parameters and design parameters are selected so as to maximize accuracy of measurement of overlay when metrology targets according to the selected values are formed by a lithographic process and measured, rather than maximizing reproducibility.

In another embodiment, there is provided a method of designing metrology targets to be formed by a lithographic process. Each target comprises a first periodic structure to be formed in a lower layer on a substrate and a second periodic structure to be formed above the first periodic structure in an upper layer on the substrate, such that overlay performance of the lithographic process can be measured by illuminating each target with radiation and observing asymmetry in certain portions of a resulting diffraction spectrum. The method comprises defining one or more metrology recipe parameters representing properties of the illuminating radiation to be used for measuring overlay; defining one or more design parameters representing the design of the target; calculating at least one of a relative amplitude and a relative phase between (i) a first radiation component representing the illuminating radiation when diffracted by the second periodic structure and (ii) a second radiation component representing the illuminating radiation when diffracted by the first periodic structure after traveling through the second layer to the first layer and returning to the second layer; and selecting values for the metrology recipe parameters and design parameters based on the calculated relative amplitude and/or relative phase so as to maximize accuracy of measurement of overlay when metrology targets according to the selected values are formed by a lithographic process and measured.

The method may further comprise forming metrology targets on a substrate in accordance with the selected parameter values.

A further embodiment provides a substrate provided with a plurality of metrology targets formed by a lithographic process. Each target comprises at least a first periodic structure being formed in a lower layer on the substrate and a second periodic structure being formed above the first periodic structure in an upper layer, such that alignment between the first and second periodic structures can be measured by illuminating each target with radiation and observing asymmetry in certain portions of a resulting diffraction spectrum. The second periodic structure is a modified grating formed to have a reduced diffraction efficiency with respect to the portions of the diffraction spectrum so that, for radiation of a certain wavelength, an amplitude of a radiation component diffracted by the second periodic structure is weakened to be of the same order as an amplitude of a radiation component diffracted by the first periodic structure that has been weakened by traveling through material of the second layer and one or more intervening layers.

In further aspects there is provided a pair of patterning devices for use in a lithographic process; a computer program product and a method of manufacturing devices wherein a sequence of product patterns is applied to a series of substrates using a lithographic process, all as defined in the appended claims.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 14A-14D illustrates the improvement of signal contrast by modifying a top grating in the design of an overlay metrology target;

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals, and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing embodiments of the invention in detail, it is instructive to present an example environment in which embodiments of the present invention may be implemented.

Figure 1:
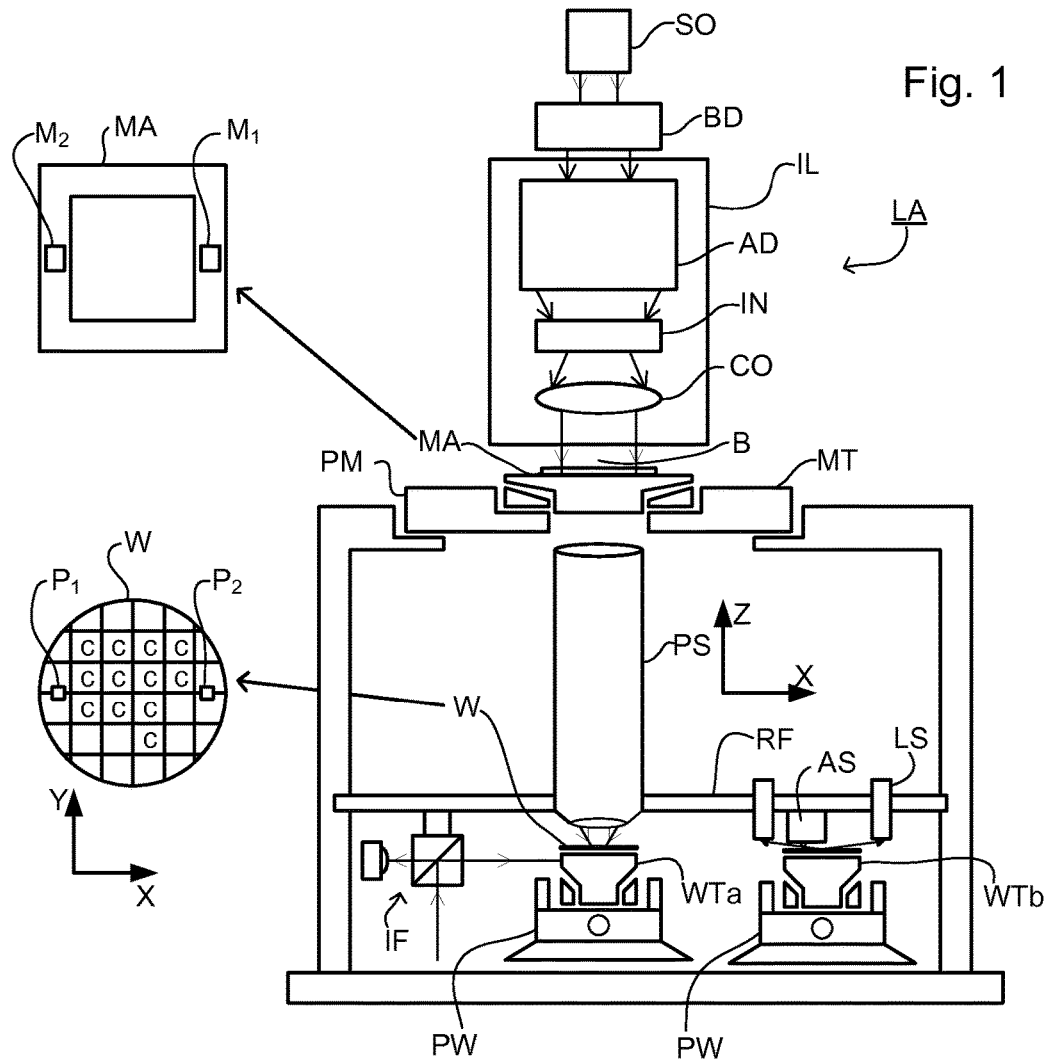
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station and a measurement station— between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS.

Figure 2:
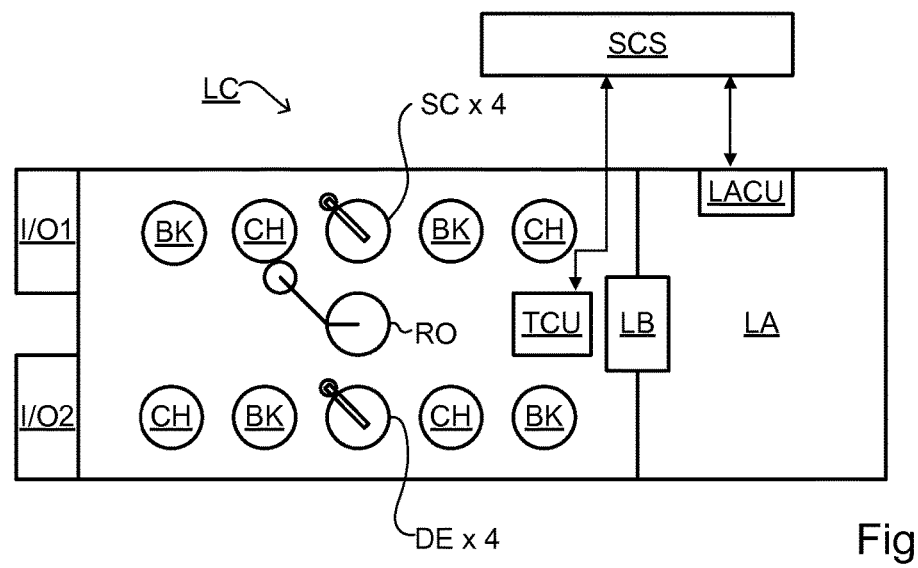
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Examples of known scatterometers include angle-resolved scatterometers of the type described in US2006033921A1 and US2010201963A1, which are incorporated by reference herein in their entireties. The targets used by such scatterometers are relatively large, e.g., 40 µm by 40 µm, gratings and the measurement beam generates a spot that is smaller than the grating (i.e., the grating is underfilled). Diffraction-based overlay metrology using dark-field detection of the diffraction orders enables overlay measurements on smaller targets. Examples of dark field metrology can be found in international patent applications WO 2009/078708 and WO 2009/106279 which documents are hereby incorporated by reference herein in their entirety. Further developments of the technique have been described in published patent publications US20110027704A, US20110043791A, US20120044470A US20120123581A, US20130258310A and US20130271740A; and in the U.S. patent application Ser. Nos. 14/403,010 and 61/803,673, which are incorporated by reference herein in their entireties. These targets can be smaller than the illumination spot and may be surrounded by product structures on a wafer. Multiple gratings can be measured in one image, using a composite grating target. The contents of all these applications are also incorporated herein by reference.

Figure 3A:
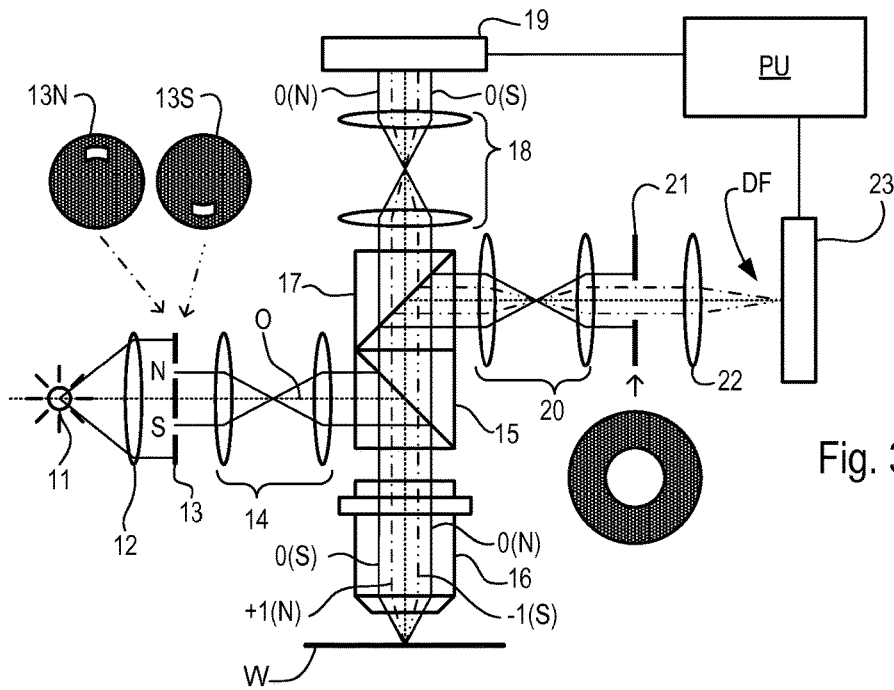
FIGS. 3A-3D comprise: 3A a schematic diagram of a dark field scatterometer for use in measuring targets according to embodiments of the invention using a first pair of illumination apertures, 3B a detail of diffraction spectrum of a target grating for a given direction of illumination, 3C a second pair of illumination apertures providing further illumination modes in using the scatterometer for diffraction based overlay measurements and 3D a third pair of illumination apertures combining the first and second pair of apertures.

A metrology apparatus (scatterometer) suitable for use in embodiments of the invention is shown in FIG. 3(a). A grating target T and diffracted rays are illustrated in more detail in FIG. 3(b). More detail of the apparatus and variations in its forma and usage are provided in US 2011027704 and other prior patent applications, mentioned above. The entire contents of those prior patent, publications, and applications are incorporated herein by reference. The scatterometer may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The aperture plates in the present examples form various off-axis illumination modes. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 3B:
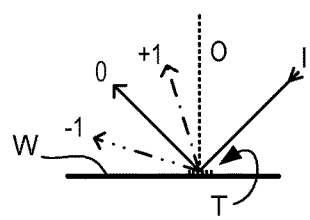

As shown in FIG. 3(b), grating target T is placed with substrate W normal to the optical axis O of objective lens 16.

A ray of illumination I impinging on target T from an angle off the axis O gives rise to a zeroth order ray (solid line 0) and two first order rays (single dot chain-dotted line +1 and double dotted chain-dotted line −1). It should be remembered that with an overfilled small target grating, these rays are just one of many parallel rays covering the area of the substrate including metrology target T and other features. Where a composite grating target is provided, each individual grating within the target will give rise to its own diffraction spectrum. Since the aperture in plate 13 has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for asymmetry measurement as well as for many measurement purposes such as reconstruction, which are not the subject of the present disclosure. The first examples to be described will use the second measurement branch to measure asymmetry.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed on sensor 23, if only one of the −1 and +1 orders is present.

The particular forms of aperture plate 13 and field stop 21 shown in FIG. 3 are purely examples. In another embodiment of the invention, on-axis illumination of the targets is used, and an aperture stop with an off-axis aperture is used to pass substantially only one first order of diffracted light to the sensor. (The apertures shown at 13 and 21 are effectively swapped in that case.) In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial light modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In practice, there are many possible types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target.

Figure 3C:
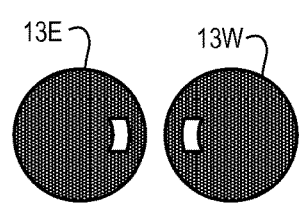

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

Figure 3D:
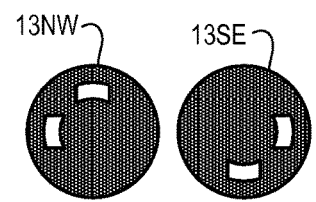

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode. A further variety of aperture plate 13Q will be illustrated in the example of FIGS. 20 and 21.

Diffraction Based Overlay Measurement—Introduction

Figure 4:
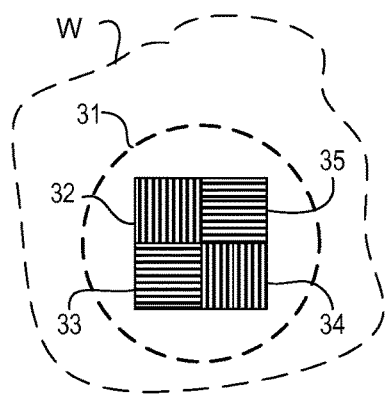
FIG. 4 depicts a known form of multiple grating target and an outline of a measurement spot on a substrate.

FIG. 4 depicts a composite metrology target formed on a substrate W according to known practice. The composite target comprises four individual overlay gratings 32 to 35 positioned closely together so that they will all be within a measurement spot 31 formed by the illumination beam of the metrology apparatus. Each of these gratings is a metrology target. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of +d, −d, respectively. This means that grating 32 has its overlying components arranged so that if they were both printed exactly at their nominal locations one of the components would be offset relative to the other by a distance d. Grating 34 has its components arranged so that, if perfectly printed, there would be an offset of d but in the opposite direction to the first grating and so on. Gratings 33 and 35 are Y-direction gratings with offsets +d and −d respectively. While four gratings are illustrated, another embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

To produce each target, it will be appreciated that grating patterns (periodic structures) are formed in at least two layers, the pattern of each layer being defined by a patterning device such as a reticle. In the example of FIG. 4 it is assumed that all four gratins are formed in the same pair of layers, but this is only one option. If desired, gratings 32 and 34 can be formed measure overlay between layer 1 and layer 2 while gratings 33 and 35 can measure overlay between different layers, for example layer 3 and layer 4.

Figure 5:
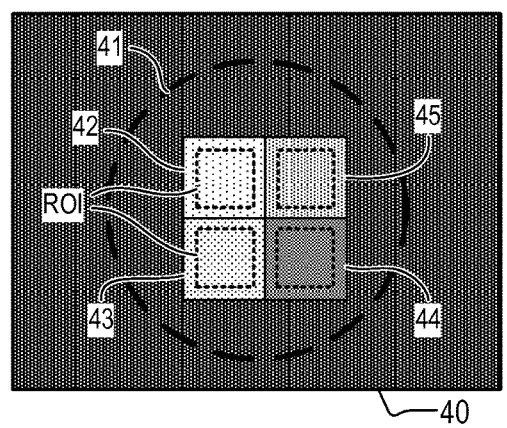
FIG. 5 depicts an image of the target of FIG. 4 obtained in the scatterometer of FIG. 3.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The cross-hatched rectangle 40 represents the field of the image on the sensor, within which the illuminated spot 31 on the substrate is imaged into a corresponding circular area 41. Ideally the field is dark. Within this dark field image, rectangular areas 42-45 represent the images of the individual gratings 32 to 35. If the gratings are located in product areas, product features may also be visible in the periphery of this image field. While only a single composite grating target is shown in the dark field image of FIG. 5, in practice a semiconductor device or other product made by lithography may have many layers, and overlay measurements are desired to be made between different pairs of layers. For each overlay measurement between pair of layers, one or more composite grating targets are required, and therefore other composite grating targets may be present, within the image field. Image processor and controller PU processes these images using pattern recognition to identify the separate images 42 to 45 of gratings 32 to 35.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter, and comparing the intensities reveals asymmetries that can be used as a measure of overlay. In another technique for measuring asymmetry and hence overlay, the pupil plane image sensor 19 is used. An example using this sensor will be described later with reference to FIGS. 20 and 21.

Signal Formation in Diffraction Based Overlay

In order to understand the source of errors of the type mentioned in the introduction, it will be useful to consider first the origin of the overlay measurement, and further to consider in detail how the signals used in the calculation are formed in diffraction-based overlay metrology. As explained above, the measurement of overlay is based on observing asymmetry between opposite portions of a diffraction spectrum formed by the target under suitable illumination. The portions comprise higher order diffracted radiation, meaning not zero order. The portions selected in these examples comprise substantially the first order, but yet higher orders can be included if desired.

Figure 6:
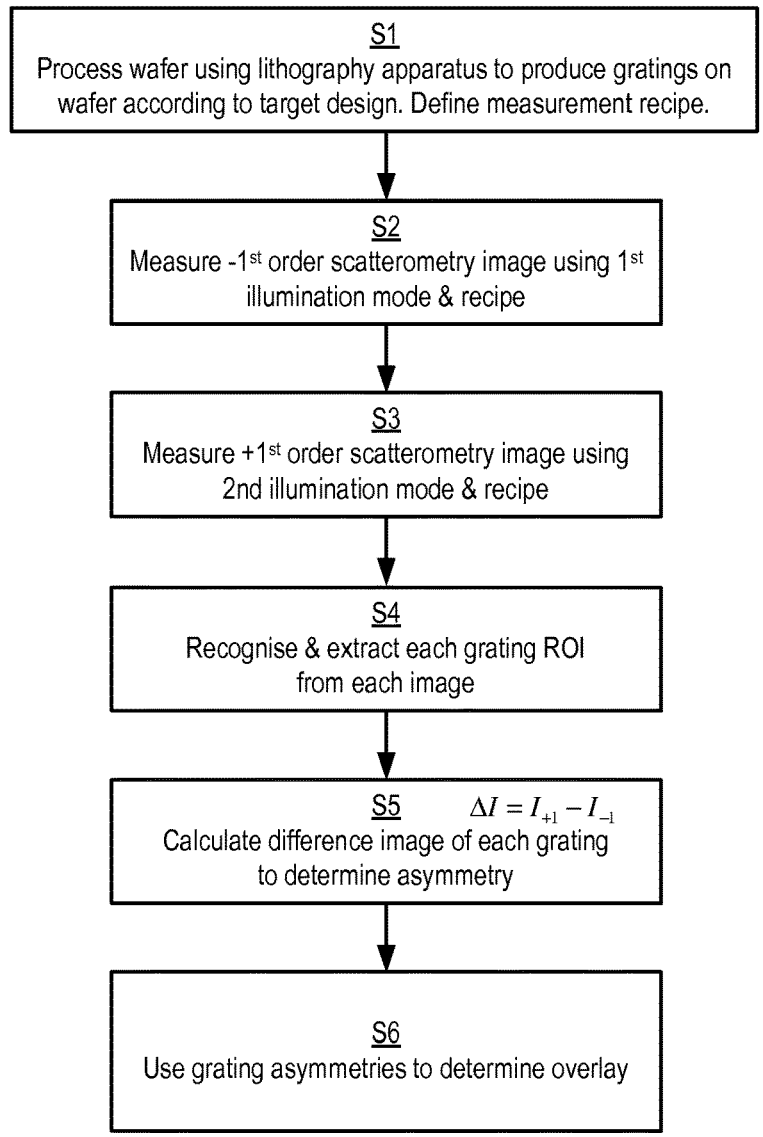
FIG. 6 is a flowchart showing the steps of an overlay measurement method using the scatterometer of FIG. 3 and novel metrology targets, in accordance with a first embodiment of the present invention.
Figure 7:
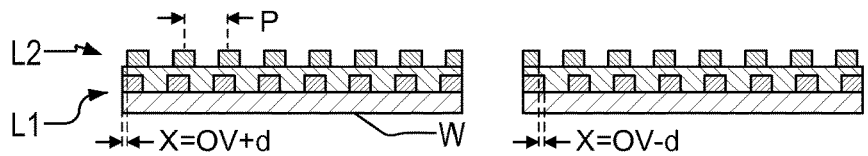
FIG. 7 is a schematic cross-section of a pair of overlay metrology targets.

FIG. 7 illustrates one pair of overlay grating targets in cross section. These may for example be the targets 32 and 34 in a composite target of the form shown in FIG. 4. A bottom grating comprises periodic structure whose features formed in a layer L1 on substrate W. A top grating with the same pitch P is formed in an upper layer L2. A displacement X between the upper and lower gratings is a combination of overlay OV which is to be measured and the programmed offset (in this example, either +d or −d). For each grating in step S5 of the FIG. 6 method, an asymmetry ΔI is calculated, by subtracting the intensities of the +1 and −1 diffraction signals. These diffraction signals can be related to the displacement X by a coefficient K, as shown in the following formula:

$$\Delta I_+ = K(OV+d) \text{ for the } +d \text{ offset and}$$

$$\Delta I_- = K(OV-d) \text{ for the } -d \text{ offset,}$$

wherein it is assumed that OV and d are much smaller than pitch P. The overlay OV is calculated from the combination of the asymmetry measurements for the different offsets, as shown by the formula:

$$OV = d \frac{\Delta I_+ + \Delta I_-}{\Delta I_+ - \Delta I_-}$$

While the above formula are well known and applied in practice, performance depends also on the selection of the best metrology "recipe", which defines for example the wavelength and polarization of the illuminating radiation. Generally the best recipe is determined by experiment. The inventors have recognized that, by reconsidering from first principles how the asymmetric diffraction signals, causes of error in the measured overlay can be revealed and addressed by target design and recipe selection methods to be described. In particular, it can be shown that criteria normally used for determining measurement quality may not give the most accurate measurement in some cases.

Figure 8:
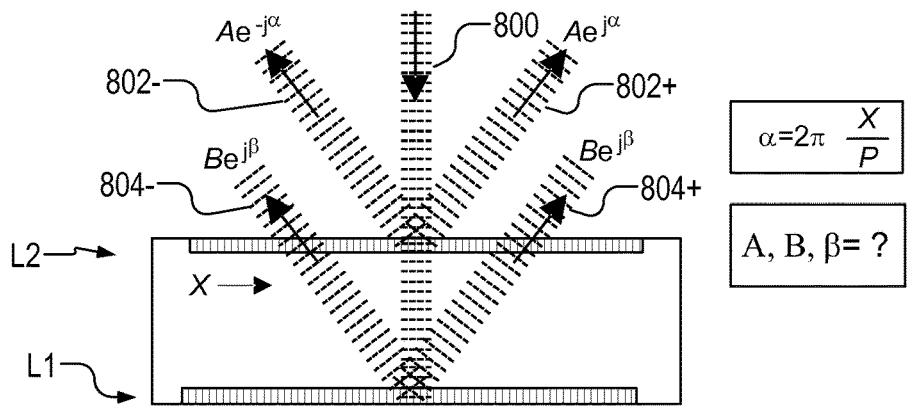
FIG. 8 illustrates first and second radiation components contributing to diffraction signals in metrology using targets such as those shown in FIG. 7.

FIG. 8 shows schematically an interaction of incident radiation (central beam 800 with bottom and top grating in the layers L1, L2. Each layer produces its own diffraction spectrum comprising for example +1st and −1st order beams 802− and 802+ diffracted by the top grating and beams 804− and 804+ diffracted by the bottom grating. These radiation components interfere with one another in the far field to yield the diffraction signal that is measured by the inspection apparatus. According to this example, top grating diffracted radiation 802+ has an amplitude A and a phase α while top grating diffracted radiation 802− representing the opposite portion of the diffraction spectrum of the has an amplitude A and a phase −α. Bottom grating diffracted radiation 804− and 804+ both defined by an amplitude B and a phase β. In this form of expression, the phase α is proportional X/P, that is the grating shift to be measured. The parameters A, B and β depend entirely on characteristics of the gratings, the intervening "stack" of layers, and the measurement recipe applied. In simple terms, the phase β represents the phase delay attributable to the need for radiation to travel through the tope grating and any intervening layers, before and after it interacts with the bottom grating itself.

Expressing the detected intensities in terms of interference between these two radiation components, we can write the following equations:

$$I_1 = |Ae^{j\alpha} + Be^{j\beta}|^2 = A^2 + B^2 + 2AB \times \cos[\beta + \alpha]$$

$$I_{-1} = |Ae^{-j\alpha} + Be^{j\beta}|^2 = A^2 + B^2 + 2AB \times \cos[\beta - \alpha]$$

Figure 9:
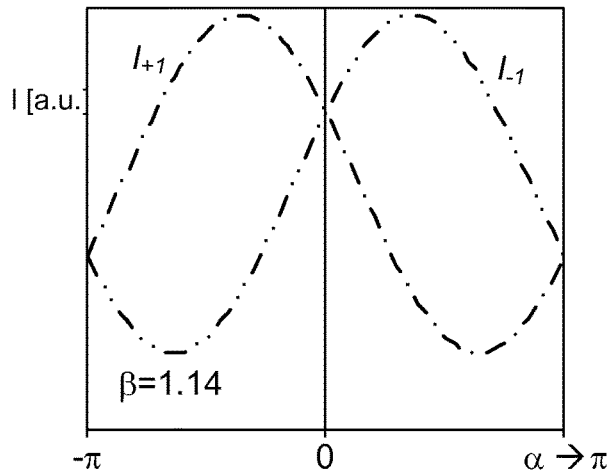
FIG. 9 shows simulated intensity signals obtained when performing diffraction-based overlay metrology on such targets.

FIG. 9 shows calculated values of intensities I+1 and I−1 against α, for an example target. Note how both signals have the form of a sinusoid, based around a non-zero average value. The value of β in this example is 1.14 radians, as shown, against shift X. The significance of β will be discussed further below.

Figure 10:
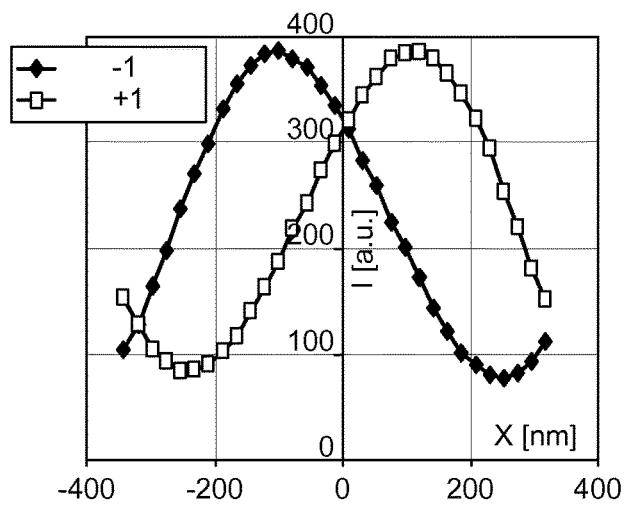
FIG. 10 shows corresponding intensity signals obtained by experiment.

FIG. 10 shows measured values of intensities I+1 and I−1 measured from a real product. It can be seen that there is good agreement with the calculated values. Looking at the graphs and FIGS. 9 and 10, the signals show good contrast. That is, they show a strong dependence on the displacement X and may be expected to yield accurate overlay measurements. Unfortunately, such good contrast is not evident in all real measurements. A contrast value CT for such a signal I+1 or I−1 can be defined by the following formula:

$$CT = \frac{I_{max} - I_{min}}{I_{max} + I_{min}}$$

where Imax and Imin are the maximum and minimum values of the relevant intensity signal over the sinusoidal variation. CT ranges from zero to a theoretical maximum of 1. In the above equations modeling the result of interference between the top and bottom grating signals, the term cos (β+α) or cos(β−α) ranges from +1 to −1 as a varies over a full cycle. The inventors have observed that best contrast in the measured intensity signals is obtained when A=B. Although it is simply stated, this dependence has not necessarily been recognized explicitly in the prior art, or applied to improve target design. It leads to an interesting observation. Value B is generally very small compared with A in real targets, because the radiation component of the bottom grating must pass twice through the intervening material layers, while the top grating, formed in freshly developed resist material not covered by any other material, gives a very strong value of A. The methods disclosed herein can also be applied in "after-etch" overlay metrology, where the top grating is formed in a product layer.

The inventors have noted that the best contrast (CT=1.0) can only be obtained when A=B. In the language of the introduction and claims, that is to say, the relative amplitude RA=A÷B of the first and second radiation components is 1. If the relative amplitude of the signals is 2 (or ½), CT will be reduced to 0.8. If RA is 4, CT is just below 0.5, and it RA is 10, CT is only 0.2.

Consequently, a design method for overly metrology targets is proposed in which the goal is not to make each grating with the strongest possible contribution to the observed diffraction signal, but one with a contribution that is more equal to that of the buried bottom grating. This may involve significantly "weakening" one of the gratings (usually the top grating), as will be explained below.

In addition to the contrast in each intensity signals that is influenced so strongly by the relative amplitude RA, the above equations reveal a strong influence of the relative phase β, as will now be explained. The target design method disclosed herein (more accurately, the target and recipe design method) seeks to optimize the value of β.

Figure 11:
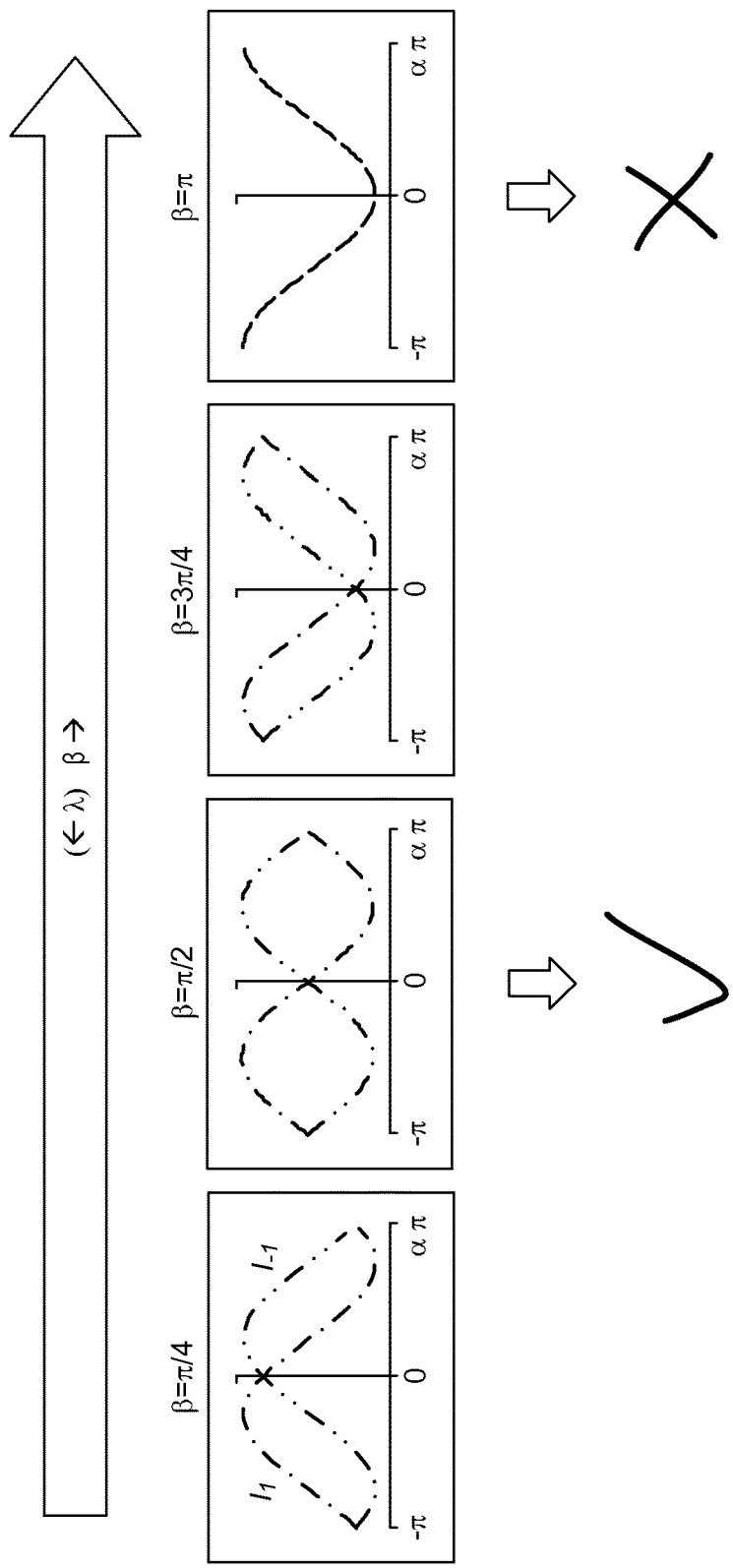
FIG. 11 illustrates the influence of relative phase between the first radiation component and the second radiation component when performing diffraction-based overlay metrology.

FIG. 11 shows the phase relationship between the intensity signals I+1 and I−1 against shift X (expressed conveniently in terms of phase α), as the fixed component β of their relative phase varies over a half cycle. For good quality measurements, the intensities should show contrasting behavior as X varies. However, as the graphs show, contrasting behavior may be present when β is around π/2, yet completely absent if β is around zero. Therefore, even if the contrast CT in each signal is very high, the contrasting behavior on which the overlay measurement also depends is highly dependent on the relative phase β. The inventors have recognized that in certain production cases present difficulty for metrology because of the value of β.

This relationship between β and measurement quality can be derived analytically also. Recall from above that the calculation of an overlay measurement OV from an observed asymmetry ΔI in intensity values depends on a coefficient K. The following equations derive a value of K in terms of the parameters A, B and β defined above. To simplify the expressions it is assumed that X<<P, so that sin(α) can be approximated by 2πX/P.

$$\Delta I = I_1 - I_{-1} = 4AB\sin(\beta)\sin(\alpha) \approx \frac{8\pi}{P}AB\sin(\beta)X$$

$$= K \cdot X$$

$$K = \frac{8\pi}{P}AB\sin(\beta) \quad [W/(m^2 \cdot nm)]$$

Figure 12:
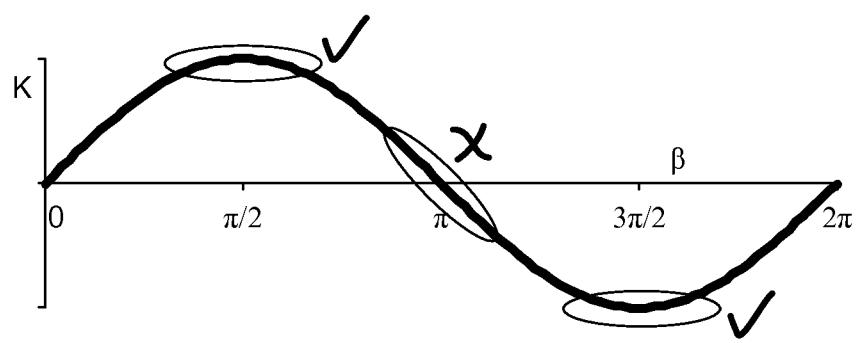
FIG. 12 illustrates the influence of relative phase on a coefficient K in the analysis of diffraction based overlay metrology.

FIG. 12 plots the value of K against β, calculated by the derived formula. Observe that K is near zero and very sensitive to β when β is around zero or π. We can predict from this that measurements of overlay will have poor sensitivity and have high dependence on process variations. When β is near either π/2 or 3π/2, on the other hand, then K is both high and relatively stable against small variations in β due to process variations.

Now, the relative phase β is a function of two terms: an effective optical path difference for the second radiation component and the wavelength λ of the radiation used for the measurement. The effective optical path difference is determined by the product design and process requirements, and cannot normally be influenced as part of a target design process. The wavelength term λ is selectable as part of the design process, and is a parameter specified in the metrology recipe. Consequently, the disclosed design method seeks to bring β as close to either π/2 or 3π/2 as possible. While process variations will mean that β is not perfectly controllable, designing it to have one of these ideal values will mean that the quality of overlay measurements is more tolerant of process variations.

In a real design problem, both the target design and/or the metrology recipe design may have several variable parameters. The optimal design solution will be a compromise between what is desired and what is achievable in a practical situation. As a simple example, an existing metrology apparatus may not have in infinitely adjustable wavelength, but only a few wavelengths to choose from. A choice of polarization may be influential. To simplify the search for an optimal solution, one or more quality measures may be defined for evaluating the success of candidate combinations of metrology recipe and target design. In particular, a measure of quality that can be applied to experimental targets may be useful.

Figure 13:
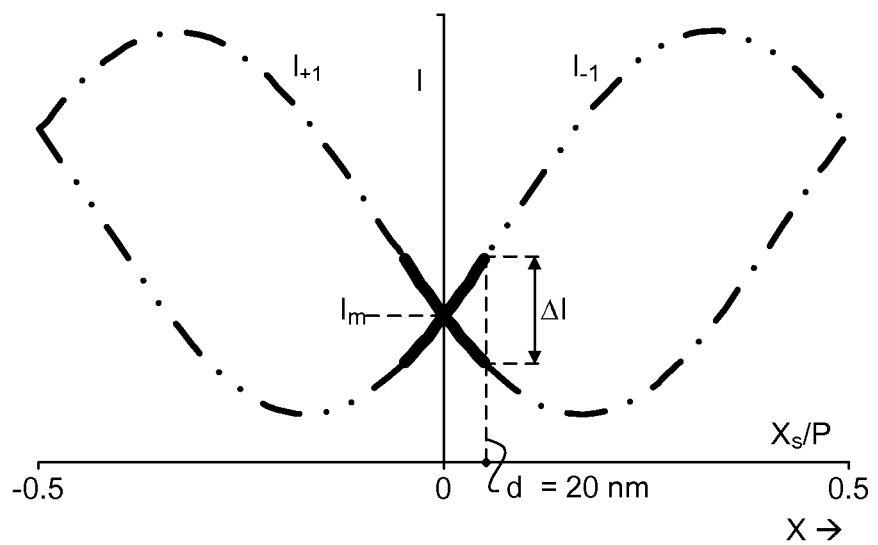
FIG. 13 illustrates values used for calculation of a signal quality indicator for overlay metrology.

FIG. 13 illustrates the derivation of a signal quality indicator S that encapsulates both the contrast criterion (relative amplitude RA close to 1) and the relative phase criterion (relative phase $\beta$ close to either $\pi/2$ or $3\pi/2$). This indicator, which may also be referred to as stack sensitivity indicator, can be used in experimental measurements on real targets, and/or in simulated measurements. In the graph, the horizontal axis represents shift X as a proportion of period P. Intensity signals I+1 and I−1 are plotted (for an ideal case where OV=0). Solid portions of the curves represent the range covered by a typical pair of biased gratings. As an example, the grating pitch in each layer may be P=700 nm and a bias ±d=±20 nm may be applied. A mean intensity Im and intensity variation ΔI can be measured (from a real sample or in simulation). For practical purposes ΔI can be defined as either the difference of one of the intensity signals between the two bias values +d and −d or the difference between the two intensity signals for one of the bias values. The latter definition of ΔI is the one illustrated on the graph, but the former definition may be convenient to use in experiments, as the influence of any unknown overlay will cancel out. The mean intensity Im is simply (I+1+I−1)/2. Defining signal quality indicator S as ΔI/Im, we can state:

$$S = 2\frac{\Delta I}{I_1 + I_{-1}}$$

Substituting the expressions derived above for the intensities in terms of parameters A, B, $\alpha$ and $\beta$, it can be shown that:

$$S \approx \frac{8\pi AB\sin(\beta)}{A^2 + B^2 + 2AB\cos(\beta)} \times \left(\frac{d}{P}\right)$$

Note that this single measure S incorporates the influence of both RA and $\beta$ in a single measure. Maximum signal quality (maximum overlay measurement accuracy) would be represented by a value S=0.5, although of course any scale can be adopted. As a guideline, one might for example choose S>0.2 as a test for adequate signal quality. The graph of FIG. 13 also illustrates a possible experimental method to verify whether We mention also that it can be verified experimentally whether $\beta=\pi/2$ or $3\pi/2$ has been achieved. The intensity of each signal I+1 and I−1 should be the same at $\alpha=0$ as it is at $\alpha=\pi$. If experimental targets are provided in both "line over line" and "line over trench" versions, this equality can be tested directly.

Concerning a practical design method, a first requirement is to be able adjust the strength of one or both of the periodic structures forming the overlay metrology target. Typically the top grating is the one that should be adjusted, as the bottom grating contribution is already weaker.

FIG. 14 shows at (a) a cross section of an example overlay metrology target in which the top grating 900 has only primary features 902 within a period P. This is a conventional grating with a 50% mark-space ratio. FIG. 14 (b) shows a modified target in which top grating is modified to have primary features 902 and secondary features 904 within each period P. The secondary features effectively introduces harmonics into the periodicity of the top grating. By this modification, radiation will be diverted into higher orders of the diffraction spectrum, outside the portions of the diffraction spectrum that are detected by the inspection apparatus.

The relative dimensions of the primary and secondary features can be adjusted as a parameter of the design. A parameter ΔCD is defined in an example implementation. At ΔCD=0, the secondary features and primary features are of equal size. As ΔCD increases, the dimensions of the secondary features diminish while the primary features increase, until only the primary features remain (FIG. 14 (a) situation). The FIG. 14 (b) situation is achieved by an intermediate value of ΔCD. Other forms of modification to weaken the top grating are of course possible. One example would be to sub-segment the grating lines in the direction orthogonal to the direction of periodicity. For example in an X-direction grating, each line could be formed as a segmented set of lines running in the Y direction.

FIGS. 14 (c) and (d) show graphically the effect of this design modification on the signal quality for overlay measurement. Again, for the sake of example, a target is designed with P=700 nm and d=20 nm. It is also assumed for this illustration that $\beta=\pi/2$ or $3\pi/2$ has been achieved. Note that the graphs in (c) and (d) have different vertical scales. The graph (c) corresponding to the conventional target (a) shows a much greater intensity of signal than the graph (d) corresponding to the modified design at (b). However, this does not indicate a better measurement. It can be shown that for the conventional target, contrast CT is only 0.55, and signal quality indicator S is only 0.23. In contrast, for the modified design (b), graph (d) reveals a contrast CT of 0.92 and a signal quality indicator S of 0.35. These values are much better than with the conventional target.

Example Design Method for Target and Metrology Recipe

Figure 15:
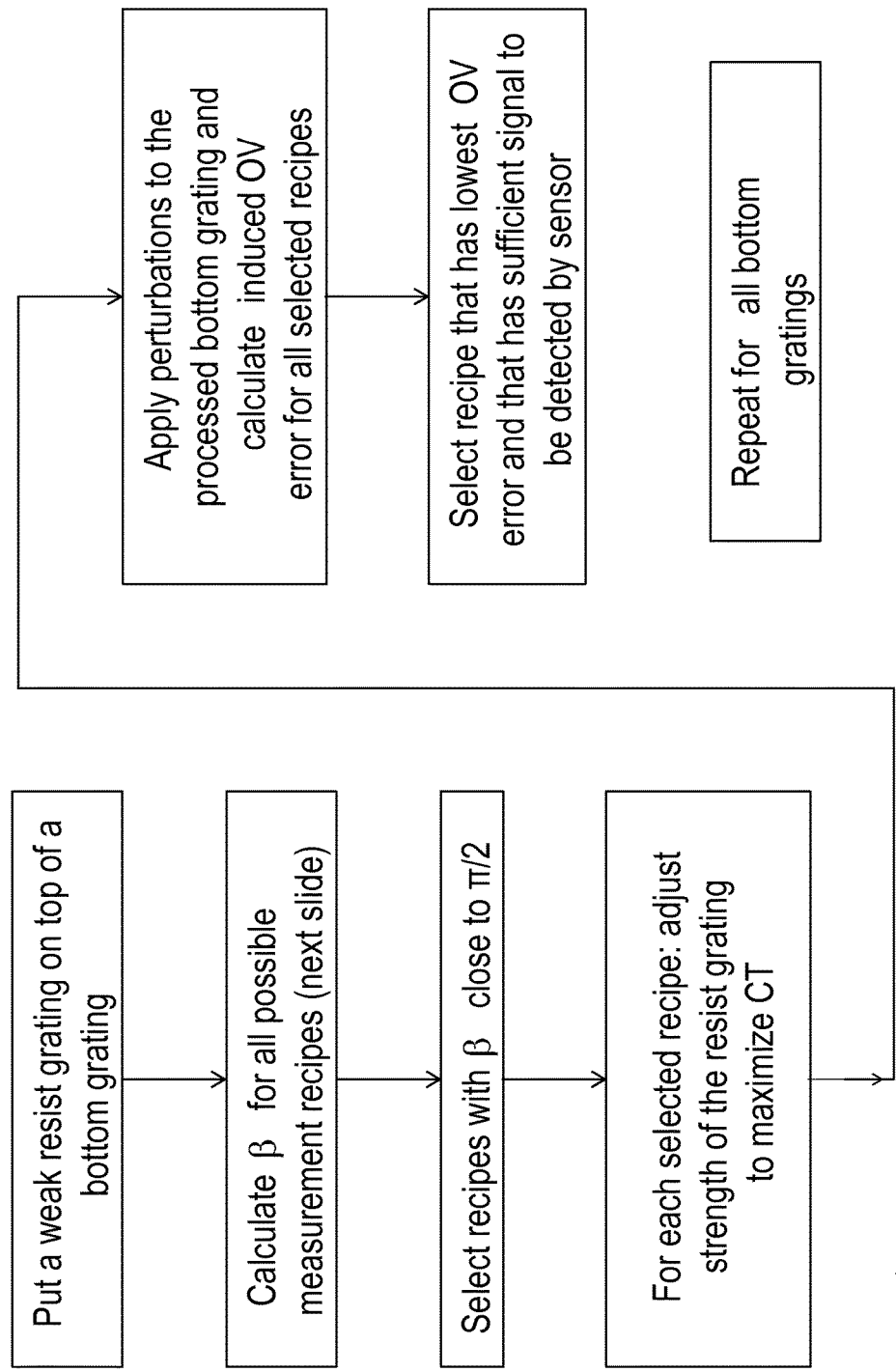
FIGS. 15 and 16 are flowcharts of an example design method according to an embodiment of the present invention.

FIG. 15 shows one example of a design method implementing the principles identified above. In this example, it is assumed that the bottom grating and stack cannot be altered by design. It is assumed that the top grating is to be applied in a resist layer and can be varied by design parameters such as ΔCD. Also the metrology recipe has parameters that can be varied by design. Main examples of such parameters are wavelength and polarization, but a real inspection apparatus may provide control of several additional parameters. The skilled reader can readily envisage other methods, and the invention is not limited to this particular example. The following steps are defined:

Put an adjustable-strength resist grating on top of the bottom grating & stack in a mathematical model of the metrology target.

Figure 16:
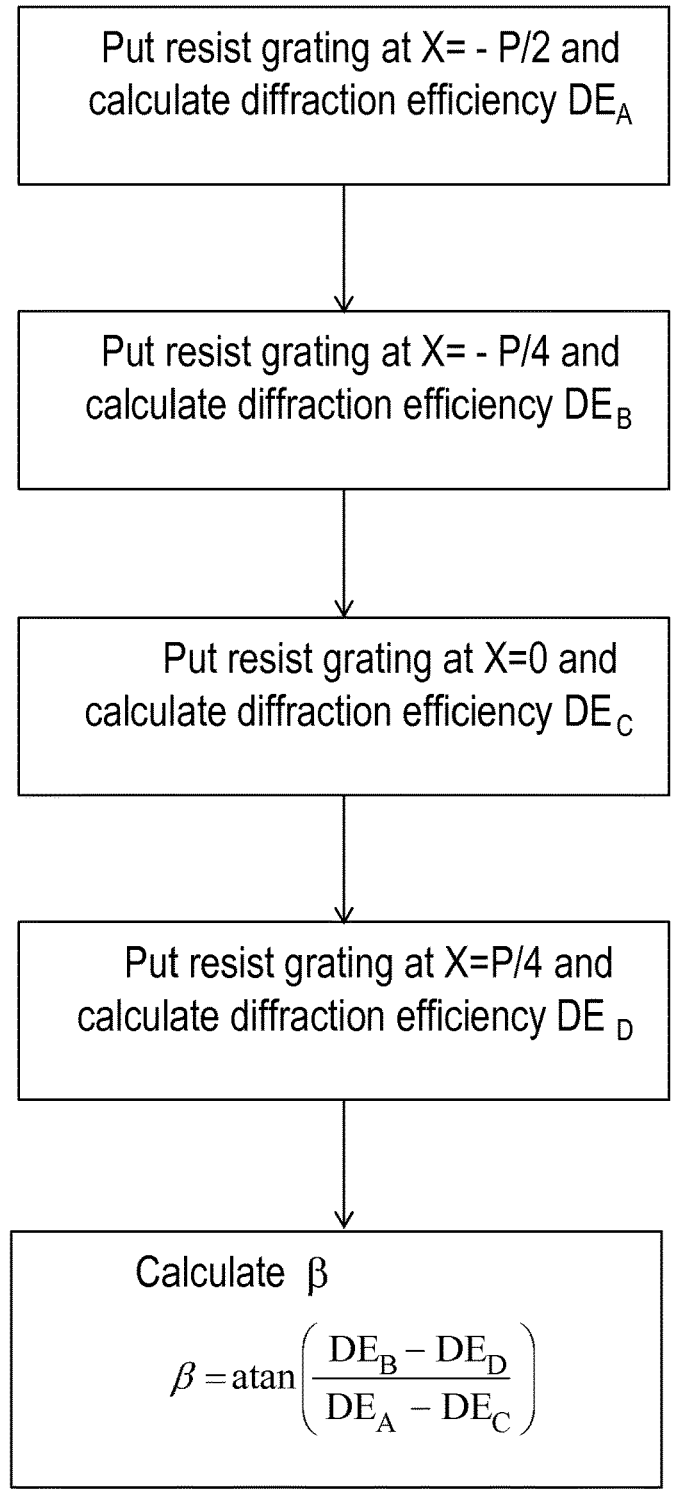

Calculate $\beta$ for all available measurement recipes (see FIG. 16 for more detail).

Select recipes with $\beta$ close to $\pi/2$ or $3\pi/2$.

For each selected recipe: adjust strength of the resist grating until "contgrast" of the observed diffracted orders is maximized.

Apply perturbations (for example a bottom grating asymmetry BGA) to the processed bottom grating and calculate the induced OV error for all selected recipes.

Select the recipe that has lowest OV error and that has sufficient signal to be detected by sensor.

The application of perturbations is effective to ensure that the selected design allows high measurement quality under a range of real conditions, and not only under ideal conditions. The above steps can be repeated for all of the product gratings on which an overlay target is desired. As noted already, the particular method steps of FIGS. 15 and 16 can be varied without departing from the principles disclosed herein. For example, while the steps of the method illustrated implicitly lead to a good value of signal quality indicator S, an alternative method might be to calculate S explicitly and use this as a basis for evaluating candidate designs and recipes.

FIG. 16 illustrates in more detail one way of performing the step of calculating β. Again, this is only one illustrative example. The steps (performed by computation using the mathematical model) are:

Put the resist grating at X=−P/2 and calculate a first diffraction efficiency DEA of the observed portions of the diffraction spectrum (for example the 1st order)

Put the resist grating at X=−P/4 and calculate a second diffraction efficiency DEB.

Put the resist grating at X=0 and calculate a third diffraction efficiency DEC

Put the resist grating at X=+P/4 and calculate a fourth diffraction efficiency DED.

Calculate relative phase β from the calculated diffraction efficiencies DEA to DED.

A formula for calculating relative phase β from the four diffraction efficiencies is:

$$\beta = \mathrm{atan}\left(\frac{DE_B - DE_D}{DE_A - DE_C}\right)$$

Figure 17:
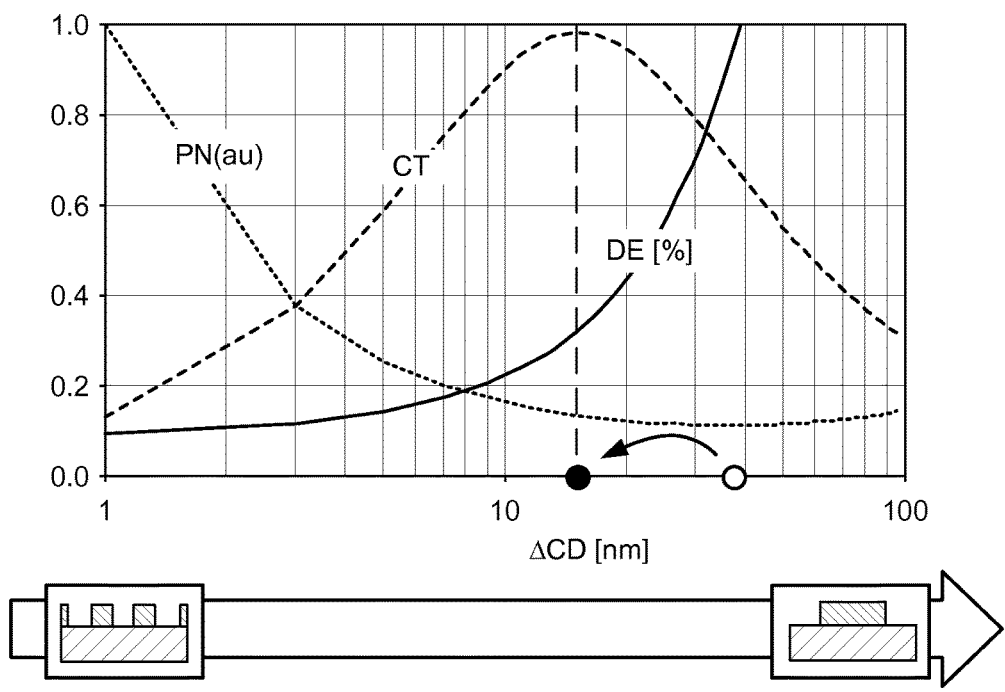
FIG. 17 is a graph showing how three different quality indicators are influenced by variation in top grating strength in an overlay metrology target designed by the method of FIG. 15.

FIG. 17 illustrates the difference between the quality indicators exploited in the above design method and quality measures currently applied in the design of metrology targets and recipes. Again, for the sake of example, a target is designed with P=700 nm and d=20 nm. The graphs shows plots of three quality parameters against the top grating strength parameter ΔCD. Grating strength varies from minimum at the left hand side to full strength at the right hand side (full strength is represented by ΔCD=100 nm in this example). The target is assumed to be perfect (with no perturbations), and β is approximately π/2.

The quality indicators plotted on the graph are:

Photon shot noise PN (in arbitrary units).

Diffraction efficiency DE of the whole target in percentage terms (on an arbitrary scale). Here DE is defined as the proportion of the incident illumination power that is diffracted into the 1st orders that are observed in the metrology method.

Contrast CT as defined above, on a scale of 0 to 1.

The first indicator is well recognized in the art and photon shot noise in particular is often used as a quality indicator to be increased. Minimizing PN brings the benefit that the resulting measurements are consistent and less susceptible to random error. This consistency is often expressed as a low "total measurement uncertainty" or TMU. The present inventors have recognized, however, that low TMU indicates measurement consistency, but is not always a good indicator of good measurement accuracy. While a conventional way of working might favor a design with the ΔCD parameter set to minimize PN and/or maximize DE. This would imply selecting a ΔCD value represented by the open circle on the ΔCD axis. The new design method based on maximizing contrast CT suggests that a better result can be obtained at the value represented by the solid circle. The slight increase in photon shot noise will increase TMU, but the measurements will be more accurate and process robust.

Application Example & Results

Figure 18:
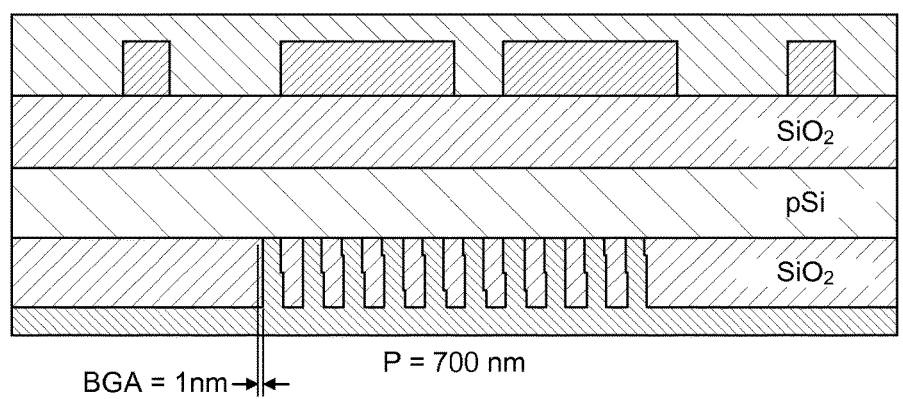
FIG. 18 illustrate the introduction of a perturbation in a mathematical model of a metrology target, as used in the method of FIG. 15.
Figure 19A:
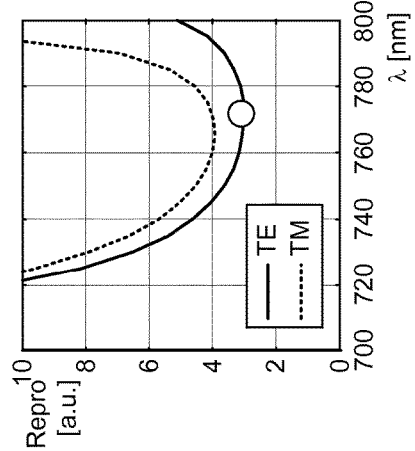
FIG. 19A-19F show graphs of six parameters against illuminating wavelength, to illustrate the process of designing a metrology recipe in the method of FIGS. 15 and 16.
Figure 19B:
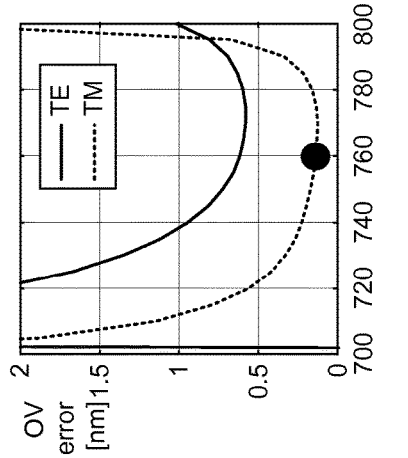
Figure 19C:
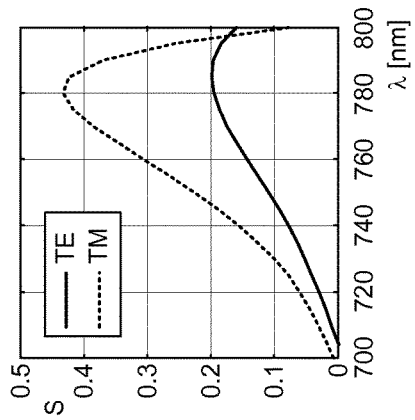
Figure 19D:
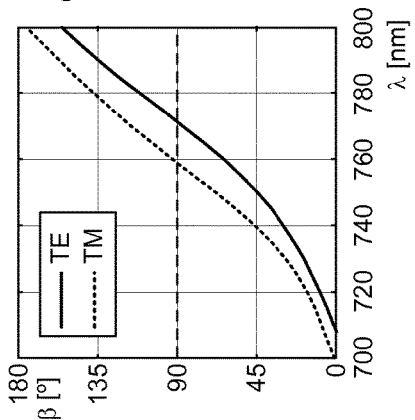
Figure 19E:
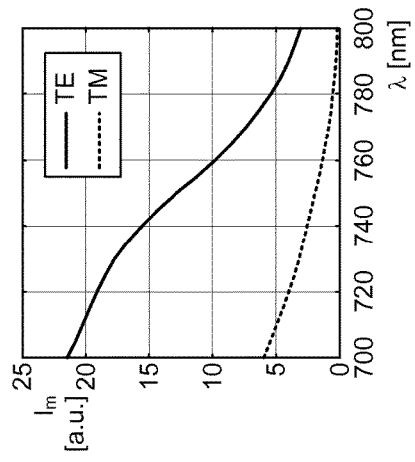
Figure 19F:
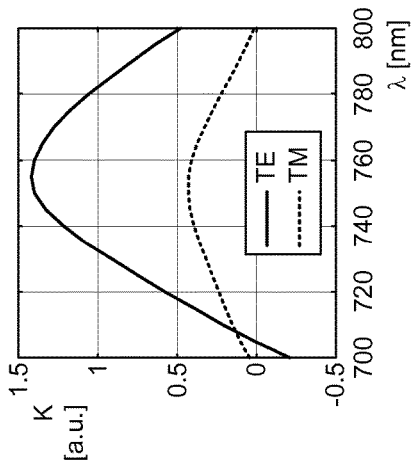

FIG. 18 illustrates an example target with P=700 nm and a weakened top grating in which ΔCD has been optimized to maximize contrast. A certain bottom grating asymmetry BGA=1 nm has been introduced as an example of a perturbation that is likely to arise in a real manufacturing process. The question for the designer of the metrology target and metrology recipe is how to obtain an accurate measurement of overlay that is relatively robust against such perturbations. It will now be shown how control of the relative phase β is an effective technique to achieve this end. Recall that β can be controlled effectively by selection of the wavelength λ of radiation used in the metrology.

FIG. 19 shows graphs (a) to (d) of four parameters of the design and measurement method, plotted against a range of wavelengths λ. Graphs (e) and (f) indicate the results. All of these measurements are based on the target of FIG. 18, with its induced bottom grating asymmetry. Measurements can be made with TE or TM polarization and these are plotted separately. A recipe can be designed to use either or both of TE and TM radiation. Considering the first four graphs, the following parameters have been discussed already above and are plotted here:

shows mean intensity Im=(I+1+I+1)/2, as defined above.

shows coefficient K as defined above.

shows stack sensitivity S as defined above.

shows relative phase β as defined above, in degrees

The graphs confirm the observations made in the above discussion. For example: a high mean intensity of the measured signals is not a good indicator of high stack sensitivity S (rather the opposite applies); a high value of K which is also relatively insensitive to variations in λ corresponds to values of λ where β is around 90 degrees (π/2 radians).

Turning to the results, graph (e) shows "repro" or reproducibility of the measurements. The white dot indicates that a conventional design process which aims to minimize TMU would suggest use of TE radiation at a wavelength somewhere above 770 nm. Graph (f) however indicates the error in overlay measurement that results from the perturbation in bottom grating asymmetry. The black dot illustrates that the recipe which results in the least error is one using TM radiation. Moreover, the graph shows that by choosing a wavelength around 760 nm, the designed operating point can be placed in the middle of a very broad minimum in the graph of overlay error against wavelength. Not only does this facilitate the selection of a suitable wavelength, if the inspection apparatus has only limited wavelengths available, it also indicates a high degree of tolerance of process-induced perturbations in real manufacturing situation.

Diffraction Based Overlay in the Pupil Plane

Figure 20:
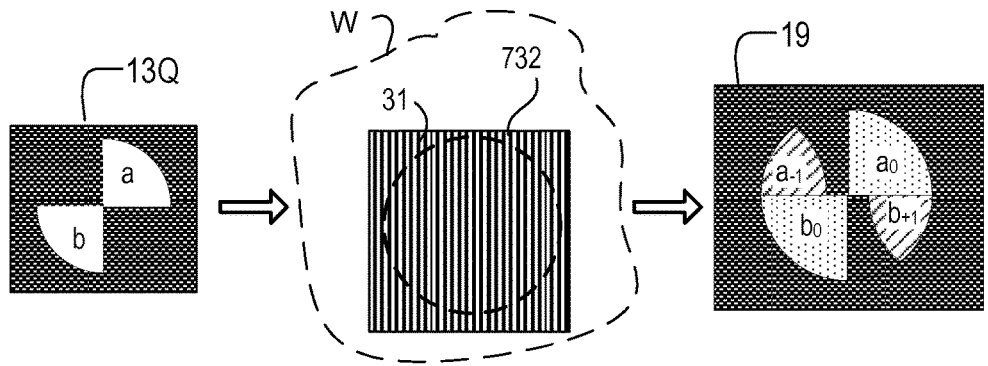
FIGS. 20 and 21 illustrated an alternative embodiment of the invention using large targets and using a pupil image sensor in the scatterometer of FIG. 3.
Figure 21:
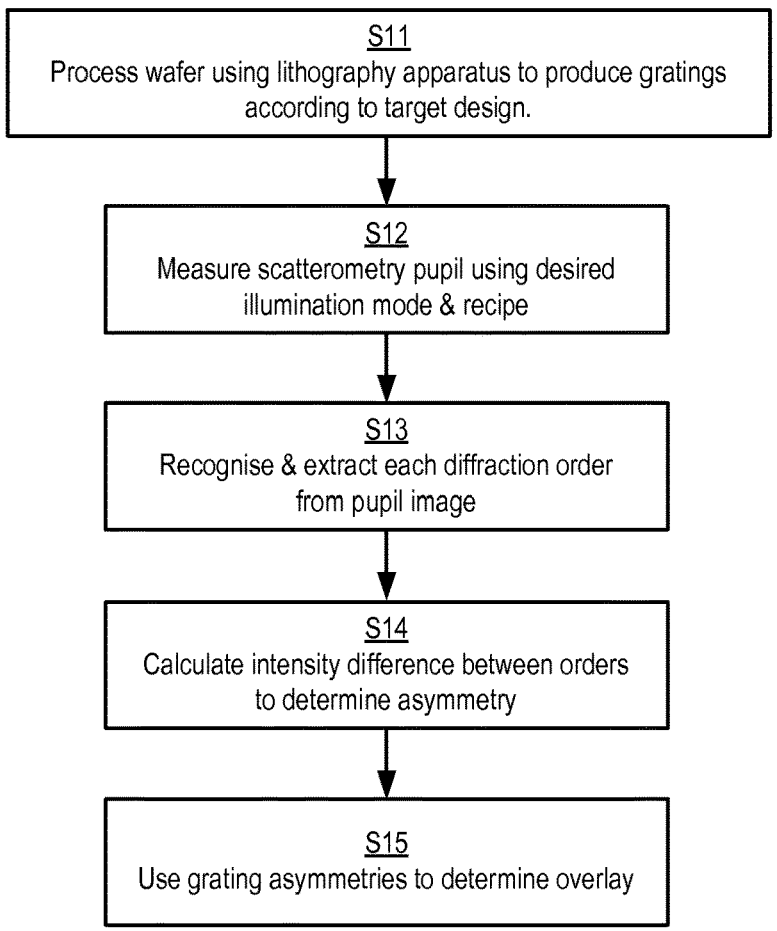

Referring to FIGS. 20 and 21, the novel method can be applied not only to small targets with dark field scatterometry, but also with large targets and angle-resolved scatterometry using the pupil plane image sensor 19. For this example, a symmetric, segmented illumination profile illustrated at 13Q is used. Two diametrically opposite quadrants, labeled a and b, are bright in this aperture pattern (transparent), while the other two quadrants are dark (opaque). This type of aperture is known in scatterometry apparatus, from the published patent application US 20100201963. As seen at the center of FIG. 12, a target grating 732 is used that is underfilled by the illumination spot 31. Not shown in the drawing, this grating 732 is part of a larger set of gratings forming component gratings of a composite target. By analogy with the example of FIG. 8, there may be component overlay gratings 732 to 735 and auxiliary component gratings 732' to 735' and 732" to 735".

Whereas, in the example of FIGS. 4 to 6, detector 23 is used in an image plane corresponding to the plane of substrate W, the method of FIGS. 12 and 13 uses the detector 19 that is positioned in a plane conjugate with a pupil plane of objective 16. Detector 19 may be an image sensor, for example a CCD camera sensor. Alternatively, individual point detectors may be deployed instead of image sensors. While the illumination pattern provided by aperture plate 13Q has bright quadrants labeled a and b at the left hand side in FIG. 12, the diffraction pattern seen by sensor 19 is represented at the right hand side. In this pattern, in addition to zero order reflections labeled a0 and b0 there are first order diffraction signals visible, labeled a−1, a+1, b−1 and b+1. Because other quadrants of the illumination aperture are dark, and more generally because the illumination pattern has 180° rotational symmetry, the diffraction orders a−1 and b+1 are "free" meaning that they do not overlap with the zero order or higher order signals from other parts of the illumination aperture. This property of the segmented illumination pattern can be exploited to obtain clear first order signals from a diffraction grating (overlay target) having a pitch which is half the minimum pitch that could be imaged if a conventional, circularly-symmetric illumination aperture were used. This diffraction pattern and the manner in which it can be exploited for scatterometry, are described in the known application US 20100201963.

FIG. 21 is a flowchart of the method of using the diffraction spectra of FIG. 20 from the targets 732 etc. to obtain overlay measurements corrected for at-resolution mismatch. The steps S11 to S15 correspond closely to the steps S1 to S6 of the FIG. 6 method, and will not be described in detail. The main difference is as follows. Recall that the FIG. 6 method obtains an asymmetry signal for grating 32 (for example) by comparing intensities of grating image 42 as seen in first and second images captured with the sensor 23. By contrast, the FIG. 21 method obtains an asymmetry signal for grating 732 (for example) by comparing intensities of the +1 and −1 diffraction orders extracted from within the same diffraction spectrum on pupil image sensor 19.

The techniques disclosed herein enable the design and use of metrology targets and recipes to achieve great accuracy of overlay measurements. The method can be applied for example to make the measurements as robust as possible against process variations, and to make them effective even in the case of particular stacks that are challenging to resolve by current ways of working.

It should be understood that the particular parameters used in the above examples are not the only ones that may be defined. Additional and/or alternative parameters can be used in a real design process, according to limitations of the lithographic apparatus and the inspection apparatus to be used for the metrology. The inspection apparatus may be an existing one, where the choice of illumination modes and wavelengths may be limited. In the case of future apparatuses having for example, a laser-pumped plasma light source, a wider choice of wavelengths may be available, and this flexibility can be fully exploited by the design methods disclosed herein. While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of designing and producing targets on a substrate, together with associated metrology recipes. This computer program may be executed for example in a separate computer system employed for the design process. Alternatively, the design process may be wholly or partly performed within unit PU in the apparatus of FIG. 3 and/or the control unit LACU of FIG. 2. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for use in a lithographic process using a pair of patterning devices comprising:
    measuring, using an inspection apparatus, a first amplitude and/or phase of light of a first radiation component of illuminating radiation, the first radiation component having been diffracted by a second periodic structure of a metrology target formed on an upper layer of a substrate;
    measuring, using the inspection apparatus, a second amplitude and/or phase of light of a second radiation component of the illuminating radiation after the second radiation component has traveled through the upper layer to a lower layer of the substrate and returning to the upper layer, the second radiation component having been diffracted by a first periodic structure of the metrology target formed on the lower layer;
    determining, using the inspection apparatus, a relative amplitude and/or phase difference between the first and second radiation components;
    generating, using the inspection apparatus, a metrology recipe parameter for the illuminating radiation and a design parameter for the metrology target based on the relative amplitude and/or phase difference,
    wherein the metrology recipe parameter and the design parameter maximize accuracy of measurement of overlay,
    wherein the metrology target has periodic structures designed according to the design parameter values generated, and whereby the metrology target with the periodic structures is utilized in conjunction with the pair of patterning devices when subsequently producing product features on the substrate.

2. The method of claim 1, wherein the target design parameters are selected so that amplitudes of the first and second components are of the same order.

3. The method of claim 1, wherein the second amplitude of the second radiation component is no more than ten times the first amplitude of the first radiation component, optionally no more than five times or two times.

4. The method of claim 1, wherein the second periodic structure comprises primary features and secondary features within each period, and the method further comprises adjusting relative dimensions of the primary and secondary features so as to divert a proportion of the illuminating radiation into unobserved portions of a diffraction spectrum of the diffraction of the illumination radiation from the target.

5. The method of claim 1, wherein:
    the first and second radiation components represent substantially radiation that has been diffracted at first order by the periodic structures, and
    unobserved portions of a diffraction spectrum of the diffraction of the illumination radiation from the metrology target includes orders higher than first order.

6. The method of claim 1, wherein the values of metrology recipe parameters and design parameters are selected so as to make the relative phase between the first and second radiation components close to $\pi/2$ or $3\pi/2$ radians rather than to 0 or $\pi$.

7. The method of claim 6, wherein a wavelength of the illuminating radiation is one of the metrology recipe parameters and is adjusted to make the relative phase between the first and second radiation components have a desired value.

8. The method of claim 1, wherein the desired value of the relative phase is $\pi/2$ or $3\pi/2$ radians.

9. The method of claim 1, further comprising selecting the values for the metrology recipe parameters and design parameters, wherein the selecting comprises:
    identifying at least one candidate design and a plurality of candidate recipes based on the relative amplitude and/or phase difference,
    for each recipe, determining simulated overlay measurements while applying simulated process variations in a mathematical model of the metrology target, and
    selecting a final combination of design and recipe based on measurement error in the simulated overlay measurements.

* * * * *